United States Patent [19]

Lur et al.

[11] Patent Number: 5,364,817
[45] Date of Patent: Nov. 15, 1994

[54] TUNGSTEN-PLUG PROCESS

[75] Inventors: Water Lur, Taipei; Cheng-Han Huang, Hsin-chu; Shih-Chanh Chang, Taichung; Liang-Chih Lin, Hsin-chu, all of Taiwan, Prov. of China

[73] Assignee: United Microelectronics Corporation, Hsinchu, Taiwan, Prov. of China

[21] Appl. No.: 238,664

[22] Filed: May 5, 1994

[51] Int. Cl.$^5$ ........................................... H01L 21/283
[52] U.S. Cl. .................... 437/192; 437/190; 437/195; 437/947; 437/982; 257/763
[58] Field of Search ............... 437/190, 192, 195, 947, 437/982; 257/751, 753, 763

[56] References Cited

U.S. PATENT DOCUMENTS

| | | | |
|---|---|---|---|
| 4,744,861 | 5/1988 | Matsunaga et al. | 156/643 |
| 4,837,051 | 6/1989 | Farb et al. | 427/97 |
| 4,962,060 | 10/1990 | Sliwa et al. | 437/192 |
| 5,063,175 | 11/1991 | Broadbent | 437/192 |
| 5,124,780 | 6/1992 | Sandhu et al. | 437/192 |
| 5,141,897 | 8/1992 | Manocha et al. | 437/228 |
| 5,216,282 | 6/1993 | Cote et al. | 257/773 |
| 5,254,498 | 10/1993 | Sumi | 437/190 |
| 5,268,329 | 12/1993 | Chittipeddi et al. | 437/195 |
| 5,312,775 | 5/1994 | Fujii et al. | 437/192 |

FOREIGN PATENT DOCUMENTS

| | | | |
|---|---|---|---|
| 2143372 | 2/1985 | United Kingdom | 437/192 |

OTHER PUBLICATIONS

IBM Technical Disclosure Bulletin, vol. 35, No. 3, Aug. 1992, pp. 37-38, "Inherent Multi-Sloped Contact...".

Primary Examiner—T. N. Quach
Attorney, Agent, or Firm—George O. Saile

[57] ABSTRACT

A method of metallization using a tungsten plug is described. A contact hole is opened to the semiconductor substrate through an insulating layer covering semiconductor structures in and on the semiconductor substrate. A glue layer is deposited conformally over the surface of the insulating layer and within the contact opening. A tungsten plug is formed within the contact opening. The glue layer is removed except for portions of the glue layer underneath the tungsten plug and on the lower sides of the tungsten plug. Ditches are left on the upper sides of the tungsten plug where the glue layer has been removed. The ditches around the tungsten plug are filled with a dielectric material. A second metallization is deposited and patterned. The patterned second metallization does not extend over one side portion of the tungsten plug; that is, there is no dog-bone formation. There is no junction damage through the side portion of the tungsten plug not covered by the second metallization because the dielectric material filling the ditches protects the glue layer from being etched away. In a second embodiment of the invention, after the contact hole is opened, the insulating layer is reflowed forming an overhang around the contact hole. A glue layer is deposited conformally over the surface of the insulating layer and within the contact opening. A tungsten plug is formed within the contact opening.

20 Claims, 4 Drawing Sheets

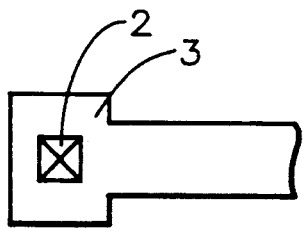
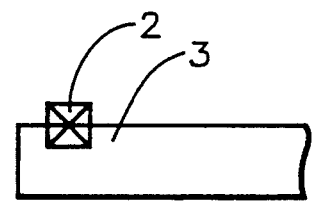
FIG. 1A *Prior Art*  FIG. 1B *Prior Art*
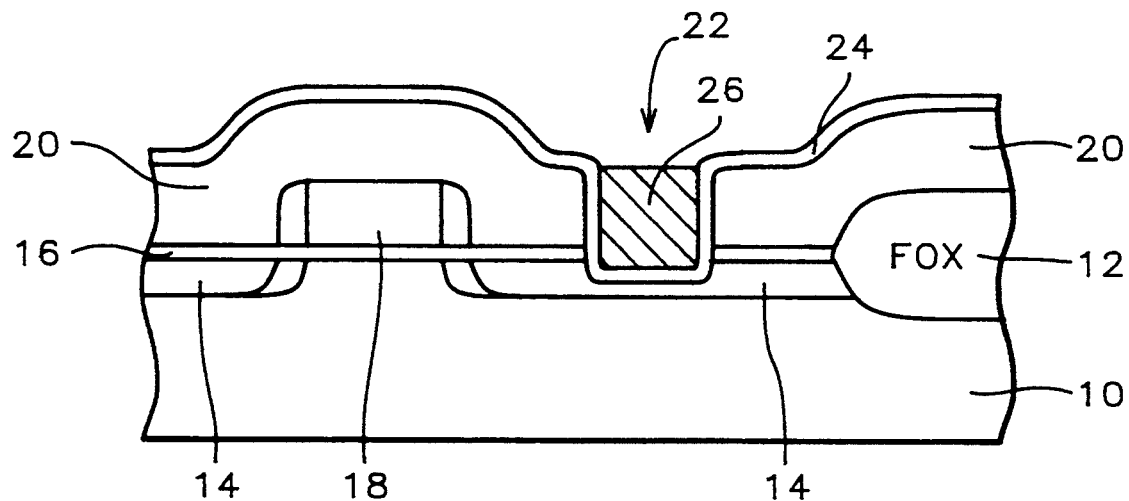
FIG. 2 *Prior Art*
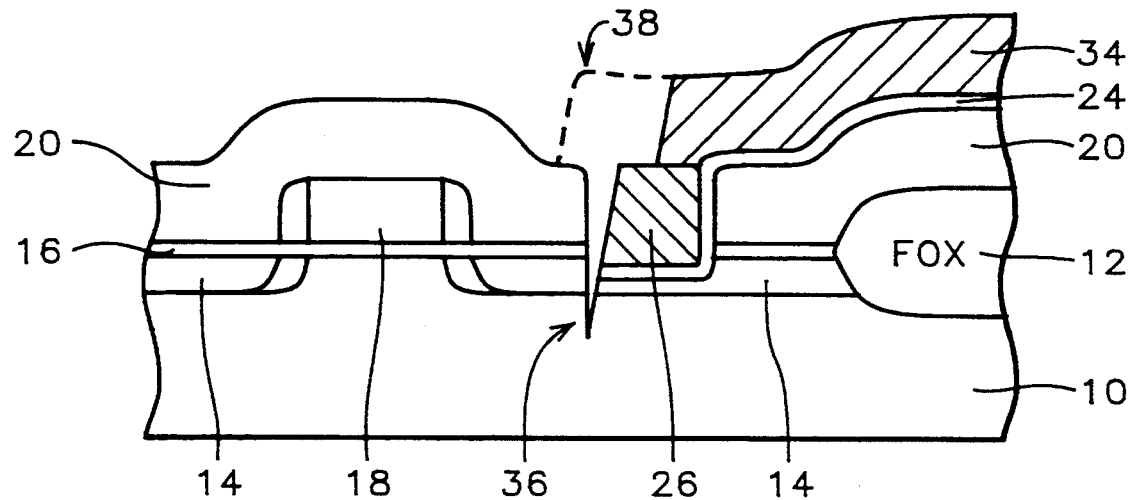
FIG. 3

TUNGSTEN-PLUG PROCESS

BACKGROUND OF THE INVENTION (1) Field of the Invention

The invention relates to a method of metallization in the fabrication of integrated circuits, and more particularly, to a method of tungsten metallization resulting in improved step coverage and prevention of junction damage in the manufacture of integrated circuits.

(2) Description of the Prior Art

Conventional aluminum metallization suffers from bad step coverage, electromigration, and dog-bone problems. Tungsten-plug metallization can improve step coverage and alleviate electromigration concern since tungsten is a kind of refractory metal with high resistance to electromigration. However, overetching of the first metal layer results in considerable junction damage if the metal layer is designed without the dog-bone overlying the tungsten plug. FIG. 1A illustrates the dog-bone 1. Contact hole 2 is surrounded by the metal 3 in the shape of a dog-bone. Fig. 1B illustrates the contact hole 2 and metal 3 without the dog bone. The misalignment problem is overcome by using the dog-bone.

Referring now to FIG. 2, there is illustrated a conventional tungsten plug process of the prior art. There is shown semiconductor substrate 10 in which have been formed Field OXide (FOX) region 12 and source/drain regions 14. Gate electrode 18 has been formed overlying gate silicon oxide layer 16. A contact hole 22 has been opened through insulating layer 20 to source/drain region 14. Glue layer 24 has been deposited over the surface of the substrate and within the contact hole. Tungsten plug 26 has been formed within the contact hole.

Referring now to FIG. 3, second metallization 34 has been deposited. After metal etching, an overetch is required to overcome the nonuniformity problem and to remove residue that will cause stringers or shorts at some valley regions. The anisotropic overetch of metal layer 34 causes junction failure 36. A dog-bone shape 38 (shown in top view in FIG. 1A) would have prevented this spiking problem which causes junction failure. However, without the dog-bone, the metal line spacing can be designed to the minimum to shrink the chip size. It is desirable to avoid the spiking problem without using a dog-bone.

U.S. Pat. No. 5,216,282 to Cote et al shows the formation of a contact stud using a sidewall structure for alignment. They partially remove one sidewall layer and then replace it with a metal stud material.

SUMMARY OF THE INVENTION

A principal object of the present invention is to provide an effective and very manufacturable method of metallization with improved step coverage and reduced electromigration problems in the fabrication of an integrated circuit.

Another object of the invention is to form a tungsten plug which does not require a dog-bone structure.

Yet another object of the invention is to provide a tungsten plug process which protects the contact area from junction failure.

A further object is to prevent stress in the contact area and to prevent junction failure caused by metal overetch.

In accordance with the objects of this invention a new method of metallization using a tungsten plug is achieved. Semiconductor structures are formed in and on a semiconductor substrate. An insulating layer covers the semiconductor structures and a contact hole has been opened through the insulating layer to the semiconductor substrate. A glue layer is deposited conformally over the surface of the insulating layer and within the contact opening. A tungsten plug is formed within the contact opening. The glue layer is removed except for portions of the glue layer underneath the tungsten plug and on the lower sides of the tungsten plug. Ditches are left on the upper sides of the tungsten plug where the glue layer has been removed. The ditches around the tungsten plug are filled with a dielectric material. A second metallization is deposited over the insulating layer and the tungsten plug. The second metallization is patterned. The patterned second metallization does not extend over one side portion of the tungsten plug; that is, there is no dog-bone formation. There is no junction damage through the side portion of the tungsten plug not covered by the second metallization because the dielectric material filling the ditches protects the glue layer from being etched away.

A second method of forming tungsten plug metallization without dog-bone and without junction damage in the fabrication of integrated circuits is achieved. Semiconductor structures are formed in and on a semiconductor substrate. An insulating layer covers the semiconductor structures and a contact hole has been opened through the insulating layer to the semiconductor substrate. The insulating layer is reflowed forming an overhang around the contact hole. A glue layer is deposited conformally over the surface of the insulating layer and within the contact opening. A tungsten plug is formed within the contact opening wherein a keyhole void is formed within the tungsten plug. A second metallization is deposited over the insulating layer and the tungsten plug. The second metallization is patterned. The patterned second metallization does not extend over one side portion of the tungsten plug; that is, there is no dog-bone formation. There is no junction damage through the side portion of the tungsten plug not covered by the second metallization because the overhang of the insulating material protects the glue layer from being etched away.

BRIEF DESCRIPTION OF THE DRAWINGS

In the accompanying drawings forming a material part of this description, there is shown:

Figs. 1A and 1B schematically illustrate in top-view the contact hole and surrounding metallization.

FIGS. 2 and 3 schematically illustrate in cross-sectional representation a conventional tungsten plug process of the prior art.

DESCRIPTION OF THE PREFERRED EMBODIMENTS

Figure 4:
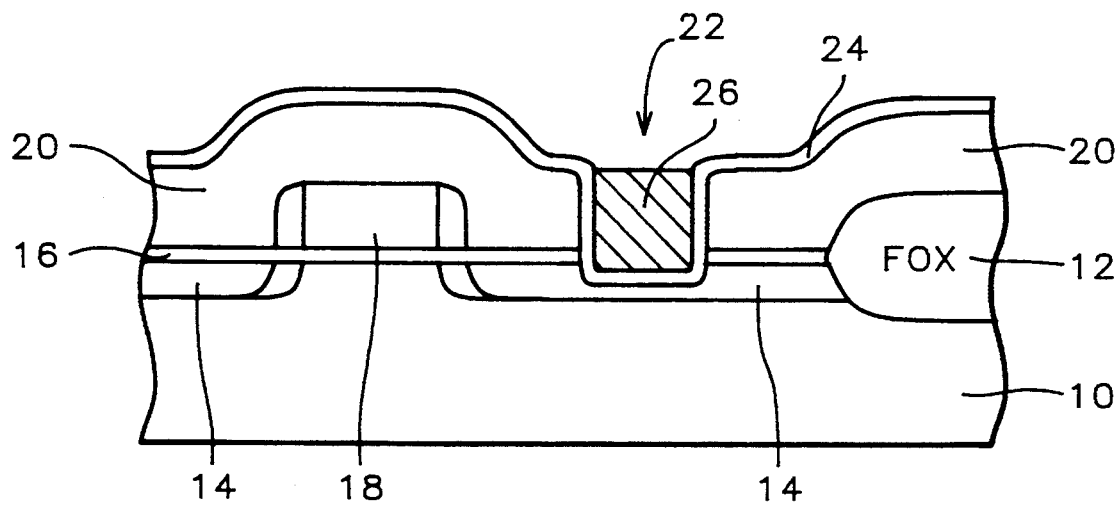
Figs. 4 through 7 schematically illustrate in cross-sectional representation one preferred embodiment of the present invention.

A first preferred embodiment of the present invention will be described with reference to FIGS. 4 through 7. Referring now more particularly to FIG. 4, there is illustrated a portion of a partially completed integrated circuit. There is shown a semiconductor substrate 10, preferably composed of monocrystalline silicon. Field OXide (FOX) region 12 is formed in and on the semiconductor substrate. Source/drain regions 14 are formed as is understood in the art either before or after formation of the gate electrode 18 overlying gate silicon oxide layer 16.

An insulating layer 20, composed of borophosphosilicate glass (BPSG), borosilicate glass (BSG), or phosphosilicate glass (PSG) is deposited over the surface of the semiconductor structures to a thickness of between about 3000 to 20,000 Angstroms. A contact hole 22 is opened through the insulating layer to the source/drain region 14 within the semiconductor substrate. A glue layer 24 is deposited conformally over the surface of the insulating layer 20 and within the contact hole 22. The glue layer preferably is composed of titanium nitride, but could be other materials such as titanium tungsten. This glue layer 24 is deposited by physical vapor deposition (PVD) or chemical vapor deposition (CVD) to a thickness of between about 300 to 2000 Angstroms.

Figure 5:
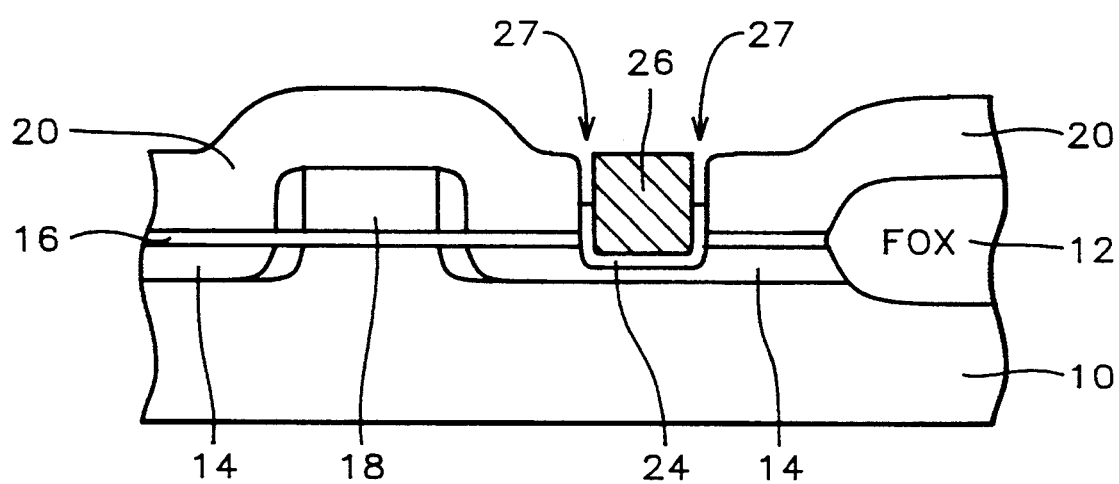

Tungsten plug 26 is formed by CVD with WF6, H2, or SiH4 as precursors with SF6 and He on the like to fill contact hole 22. Referring now to FIG. 5, the glue layer 24 is partially removed by either a dry or wet etch, such as dipping in a solution of ammonium hydroxide (NH4OH), hydrogen peroxide (H2O2), and water (H2O) for between about 3 to 10 minutes. The portions of the glue layer underneath the tungsten plug and on the lower sides of the tungsten plug are not removed. The etch selectivity of titanium nitride to tungsten is greater than 30 to 1, so that the tungsten is not significantly etched during partial removal of the glue layer. (The selectivity of titanium tungsten to tungsten is less than 3 to 1, which is why titanium nitride is preferred.) Ditches 27 are left on the upper sides of the tungsten plug.

Figure 6:
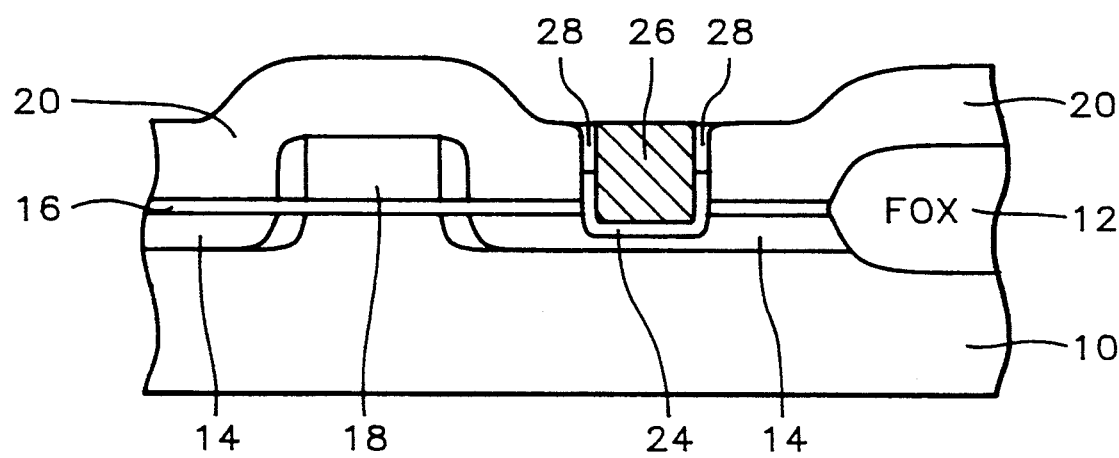

Referring now to FIG. 6, a dielectric material 28, such as silicon dioxide, silicon nitride, or silicon oxynitride (SiNxOy) is deposited by chemical vapor deposition (CVD) over the surface of the substrate and within the ditches 27. The dielectric is etched back to fill the ditches. This dielectric will protect the lower glue layer 24 from subsequent etching.

Figure 7:
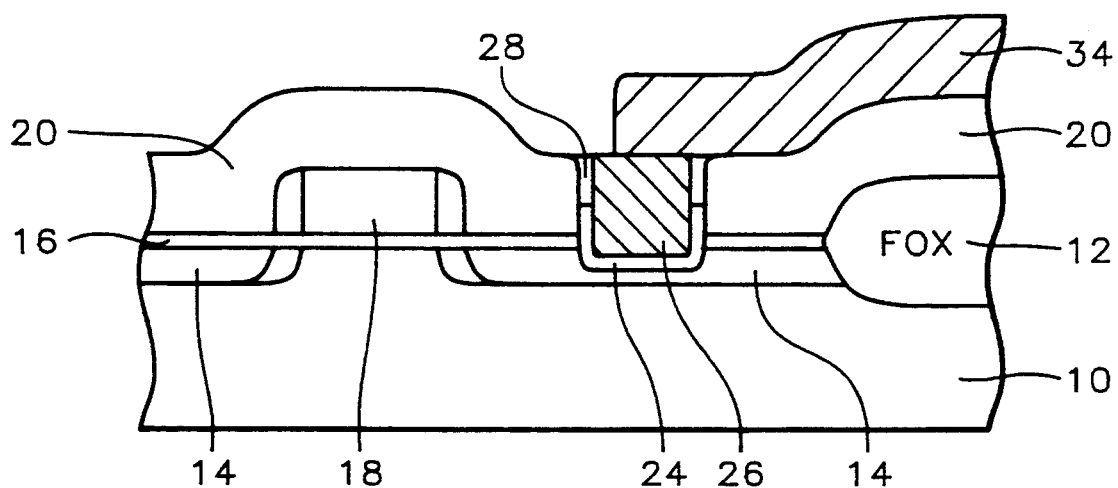

Referring to FIG. 7, the second metallization 34, such as an aluminum alloy, is deposited and patterned. No dog-bone is needed; that is, the metal 34 does not need to extend over one side of the tungsten plug 26. The dielectric 28 protects the underlying glue layer 24 from being etched during the etching of the metal layer 34, thus preventing spiking and junction failure such as occurs in FIG. 3 of the prior art. The dog-bone is not needed for alignment. Even if there is misalignment without the dog-bone, the contact structure of the invention keeps its integrity without the spiking problem after metal etchback.

Figure 8:
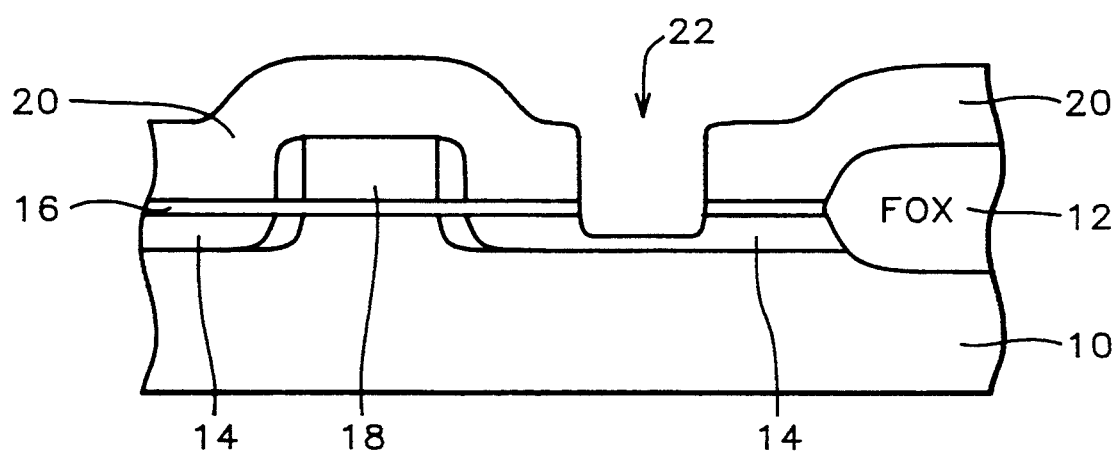
FIGS. 8 through 11 schematically illustrate in cross-sectional representation a second preferred embodiment of the present invention.

A second preferred embodiment of the present invention will be described in reference to FIGS. 8 through 11. Referring now to FIG. 8, there is shown the same semiconductor substrate as described for FIG. 4 after the step of opening contact hole 22. After contact hole 22 has been opened, the insulator layer 20 is reflowed. This is done in a conventional furnace at a temperature of between about 850° to 950° C. for between about 10 to 30 minutes in a nitrogen or nitrogen and oxygen ambient. Alternatively, the reflow could be accomplished by rapid thermal annealing at a temperature of between about 950° to 1050° C. for between about 10 to 60 seconds.

Figure 9:
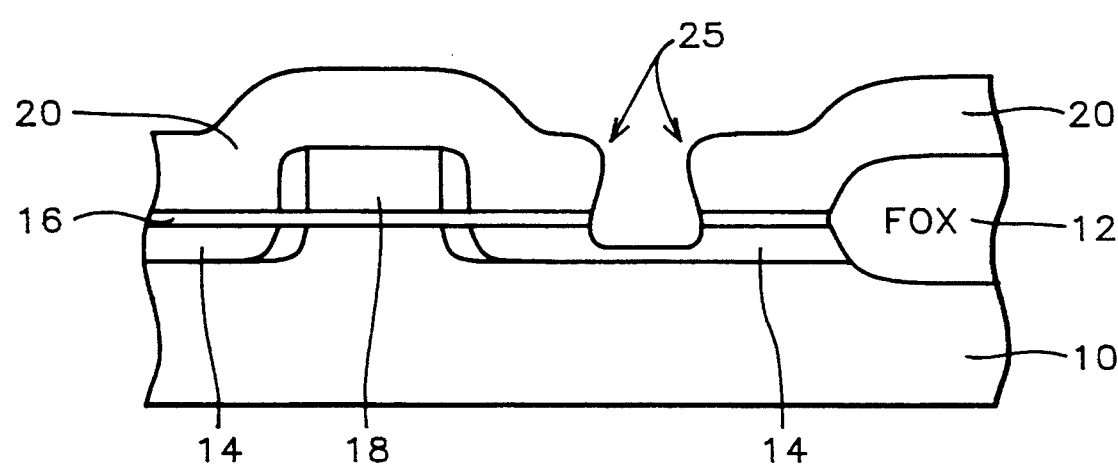
Figure 10:
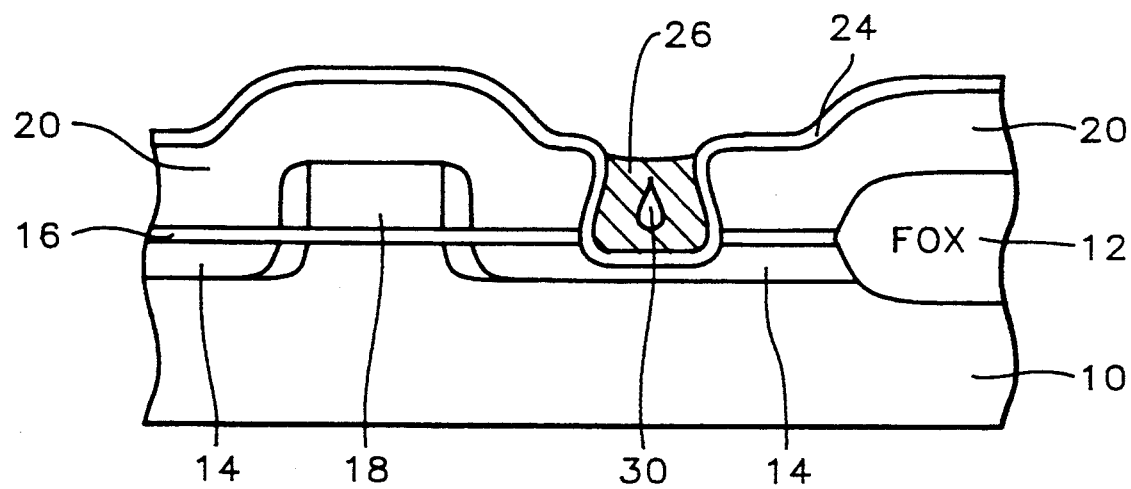

FIG. 9 illustrates the overhang 25 over the contact hole 22 that is formed as a result of the reflow. This overhang will prevent junction damage. Referring now to FIG. 10, glue layer 24 is deposited conformally over the surface of the insulating layer 20 and within the contact hole 22. The glue layer preferably is composed of titanium nitride, but could also be titanium tungsten as in the first embodiment. This glue layer 24 is deposited by PVD or CVD to a thickness of between about 300 to 2000 Angstroms.

Tungsten plug 26 is formed by CVD with WF6, H2, or SiH4 as precursors and etchback with SF6 and He or the like to fill contact hole 22. A keyhole void 30 is formed within the tungsten plug. The presence of the keyhole can release stress within the tungsten plug. The conformity of the tungsten will result in the overhang within the contact hole resulting in void 30.

Figure 11:
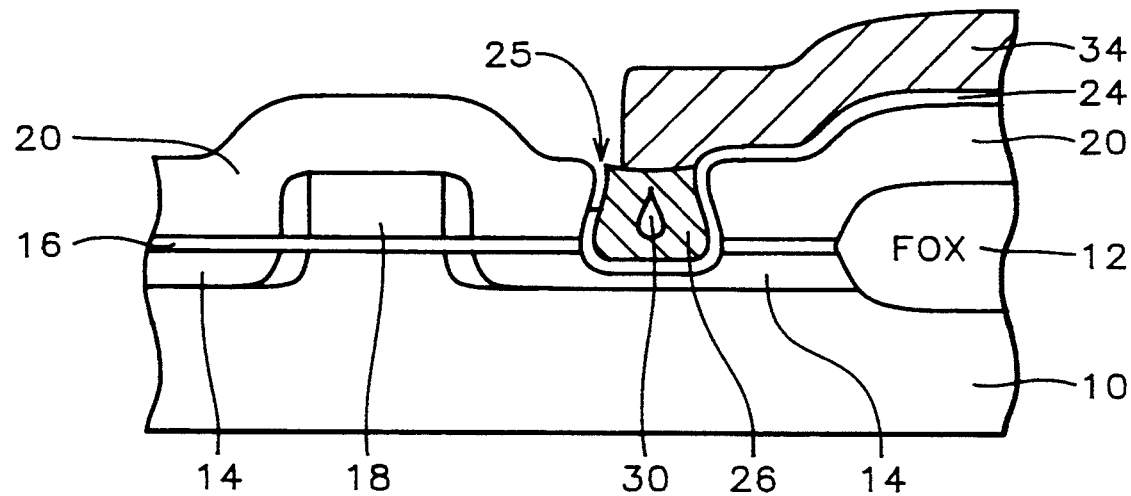

Referring now to FIG. 11, the second metallization 34, such as an aluminum alloy, is deposited and patterned. No dog-bone is needed; that is, the metal 34 does not need to extend over one side of the tungsten plug 26. The overhang 25 of the insulating layer 20 protects the underlying glue layer 24 from being etched during the etching of the metal layer 34, thus preventing spiking and junction failure such as occurs in FIG. 3 of the prior art.

While the invention has been particularly shown and described with reference to the preferred embodiments thereof, it will be understood by those skilled in the art that various changes in form and details may be made without departing from the spirit and scope of the invention.

What is claimed is:

1. A method of forming tungsten plug metallization without dog-bone and without junction damage in the fabrication of integrated circuits comprising:

providing semiconductor structures in and on a semiconductor substrate;

providing an insulating layer covering said semiconductor structures wherein a contact hole has been opened through said insulating layer to said semiconductor substrate;

depositing a glue layer conformally over the surface of said insulating layer and within said contact opening;

forming a tungsten plug within said contact opening;

removing said glue layer except for portions of said glue layer underneath said tungsten plug and portions of said glue layer on the lower sides of said tungsten plug wherein ditches are left on the upper sides of said tungsten plug where said glue layer has been removed;

filling said ditches around said tungsten plug with a dielectric material;

depositing a second metallization over said insulating layer and said tungsten plug;

patterning said second metallization wherein said patterned second metallization does not extend over one side portion of said tungsten plug; that is, there is no dog-bone formation; and wherein there is no junction damage through said side portion of said tungsten plug not covered by said second metallization because said dielectric material filling said ditches protects said glue layer from being etched away completing fabrication of said integrated circuit.

2. The method of claim 1 wherein said glue layer is composed of titanium nitride and has a thickness of between about 300 to 2000 Angstroms.

3. The method of claim 1 wherein said glue layer is composed of titanium tungsten and has a thickness of between about 300 to 2000 Angstroms.

4. The method of claim 1 wherein portions of said glue layer are removed by wet etching in a solution of NH4OH:H2O2:H2O for between about 3 to 10 minutes.

5. The method of claim 1 wherein portions of said glue layer are removed by dry etching with chemicals in a group comprising HBr, Cl2, and O2.

6. The method of claim 1 wherein said filling ditches around said tungsten plug comprises the steps of:

depositing a dielectric material by chemical vapor deposition over the surface of said substrate; and etching back said dielectric material wherein said dielectric material fills said ditches and is removed from all other surfaces of said substrate.

7. The method of claim 1 wherein said dielectric material is silicon dioxide.

8. The method of claim 1 wherein said dielectric material is silicon nitride.

9. The method of claim 1 wherein said dielectric material is silicon oxynitride (SiNxOy).

10. The method of claim 1 wherein said second metallization is aluminum.

11. The method of claim 1 wherein said second metallization is aluminum alloy.

12. A method of forming tungsten plug metallization without dog-bone and without junction damage in the fabrication of integrated circuits comprising:

providing semiconductor structures in and on a semiconductor substrate;

providing an insulating layer covering said semiconductor structures wherein a contact hole has been opened through said insulating layer to said semiconductor substrate;

reflowing said insulating layer wherein an overhang forms on either side of said contact hole;

depositing a glue layer conformally over the surface of said insulating layer and within said contact opening;

forming a tungsten plug within said contact opening wherein a keyhole void is formed within said tungsten plug;

depositing a second metallization over said insulating layer and said tungsten plug;

patterning said second metallization wherein said patterned second metallization does not extend over one side portion of said tungsten plug; that is, there is no dog-bone formation; and wherein there is no junction damage through said side portion of said tungsten plug not covered by said second metallization because said overhang of said insulating material protects said glue layer from being etched away; completing fabrication of said integrated circuit.

13. The method of claim 12 wherein said insulating layer is composed of borophosphosilicate glass.

14. The method of claim 12 wherein said insulating layer is composed of borosilicate glass.

15. The method of claim 12 wherein said insulating layer is composed of phosphosilicate glass.

16. The method of claim 12 wherein said insulating layer is reflowed in a furnace at a temperature of between about 850° to 950° C. for between about 10 to 60 minutes in a nitrogen ambient.

17. The method of claim 12 wherein said insulating layer is reflowed by rapid thermal annealing at a temperature of between about 95° to 1050° C. for between about 10 to 60 seconds.

18. The method of claim 12 wherein said glue layer is composed of titanium nitride and has a thickness of between about 300 to 2000 Angstroms.

19. The method of claim 12 wherein said glue layer is composed of titanium tungsten and has a thickness of between about 300 to 2000 Angstroms.

20. The method of claim 12 wherein said keyhole void within said tungsten plug is formed by the conformal chemical vapor deposition of tungsten within said contact hole with said overhanging insulating layer and wherein said keyhole void causes the release of stress within said tungsten plug.

* * * * *